(12) United States Patent
Wakabayashi et al.

(10) Patent No.: US 10,786,864 B2
(45) Date of Patent: Sep. 29, 2020

(54) METHOD FOR MANUFACTURING SHUNT RESISTOR

(71) Applicant: Suncall Corporation, Kyoto-shi, Kyoto-fu (JP)

(72) Inventors: Shojiro Wakabayashi, Kyoto (JP); Hiroya Kobayakawa, Kyoto (JP)

(73) Assignee: Suncall Corporation, Kyoto-shi, Kyoto-fu (JP)

( * ) Notice: Subject to any disclaimer, the term of this patent is extended or adjusted under 35 U.S.C. 154(b) by 238 days.

(21) Appl. No.: 15/778,934

(22) PCT Filed: Nov. 24, 2016

(86) PCT No.: PCT/JP2016/084703
§ 371 (c)(1),
(2) Date: May 24, 2018

(87) PCT Pub. No.: WO2017/110354
PCT Pub. Date: Jun. 29, 2017

(65) Prior Publication Data
US 2018/0333800 A1  Nov. 22, 2018

(30) Foreign Application Priority Data

Dec. 25, 2015  (JP) .................................. 2015-253846

(51) Int. Cl.
*B23K 26/00* (2014.01)
*B23K 15/00* (2006.01)
(Continued)

(52) U.S. Cl.
CPC .......... *B23K 15/0046* (2013.01); *B23K 15/00* (2013.01); *B23K 26/21* (2015.10);
(Continued)

(58) Field of Classification Search
CPC .... B23K 15/00; B23K 15/0046; B23K 26/21; G01R 15/00; G01R 15/146; G01R 1/203;
(Continued)

(56) References Cited

U.S. PATENT DOCUMENTS 6,060,682 A    5/2000 Westbroek et al.
2005/0258930 A1* 11/2005 Ishida ................... H01C 1/144
                                                338/309

(Continued)

FOREIGN PATENT DOCUMENTS

DE    41 04 256 A1    8/1992
JP    59-156585       5/1984
(Continued)

OTHER PUBLICATIONS

International Search Report issued in International Application No. PCT/JP2016/084703, dated Feb. 7, 2017.
(Continued)

*Primary Examiner* — Hung D Nguyen
(74) *Attorney, Agent, or Firm* — Sterne, Kessler, Goldstein & Fox P.L.L.C.

(57) ABSTRACT

In manufacturing method of shunt resistor according to the present invention, at least one of first and second conductors that is thicker than a resistance alloy plate member includes a joining surface abutted to the resistance alloy plate member with their edges on one side in a plate-thickness direction being aligned with each other, a first inclined surface that is gradually located on one side in the plate-thickness direction from the joining surface toward the side opposite to the resistance alloy plate member in the plate-surface direction, and a first plate surface extending to the side opposite to the resistance alloy plate member in the plate-surface direction from the first inclined surface. Electron beams or laser is emitted to the joining surfaces of the conductor having the
(Continued)

larger thickness and the resistance alloy plate member from one side in the plate-thickness direction to weld the joining surfaces.

4 Claims, 11 Drawing Sheets

(51) Int. Cl.
    *G01R 15/00*     (2006.01)
    *B23K 26/21*     (2014.01)
    *H01C 13/00*     (2006.01)
    *H01C 17/00*     (2006.01)

(52) U.S. Cl.
    CPC ............. *G01R 15/00* (2013.01); *H01C 13/00* (2013.01); *H01C 17/00* (2013.01)

(58) Field of Classification Search
    CPC ........ H01C 17/00; H01C 17/22; H01C 17/24; H01C 17/245; H01C 17/28; H01C 17/281
    USPC ............ 219/121.12, 121.13, 121.14, 121.15, 219/121.63, 121.82, 124.22, 121.31, 219/121.6, 121.64
    See application file for complete search history.

(56) References Cited

U.S. PATENT DOCUMENTS

| | | | | |
|---|---|---|---|---|
| 2013/0133826 A1* | 5/2013 | Lo | ........................ | H01C 17/28 156/272.8 |
| 2014/0097933 A1* | 4/2014 | Yoshioka | ............... | H01C 1/144 338/332 |
| 2017/0003322 A1* | 1/2017 | Nakamura | ........... | G01R 15/146 |
| 2017/0125142 A1* | 5/2017 | Nakamura | ............. | H01C 1/148 |

FOREIGN PATENT DOCUMENTS

| | | | |
|---|---|---|---|
| JP | 59-156585 | A | 9/1984 |
| JP | 60-006273 | A | 1/1985 |
| JP | 60-006273 | | 12/1985 |
| JP | 61-229489 | | 10/1986 |
| JP | 61-229489 | A | 10/1986 |
| JP | 63-168286 | | 7/1988 |
| JP | 63-168286 | A | 7/1988 |
| JP | 04-367304 | | 12/1992 |
| JP | 04-367304 | A | 12/1992 |
| JP | 2003-126978 | | 10/2001 |
| JP | 2003-126978 | A | 5/2003 |
| JP | 2008-039571 | | 2/2008 |
| JP | 2015-145813 | | 8/2015 |
| JP | 2015-145813 | A | 8/2015 |
| WO | WO 2013/179461 | A1 | 5/2013 |

OTHER PUBLICATIONS

International Preliminary Report on Patentability issued in PCT/JP2016/084703, dated Jul. 5, 2018.

* cited by examiner

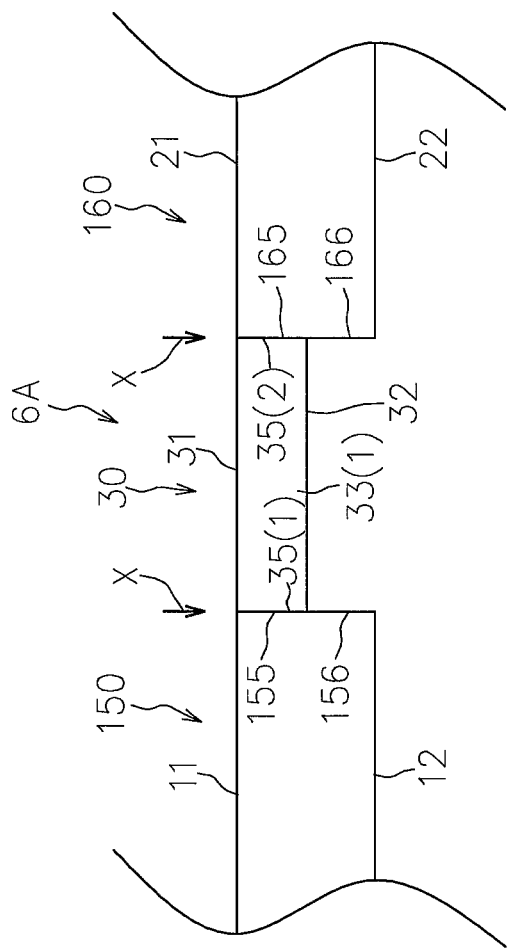
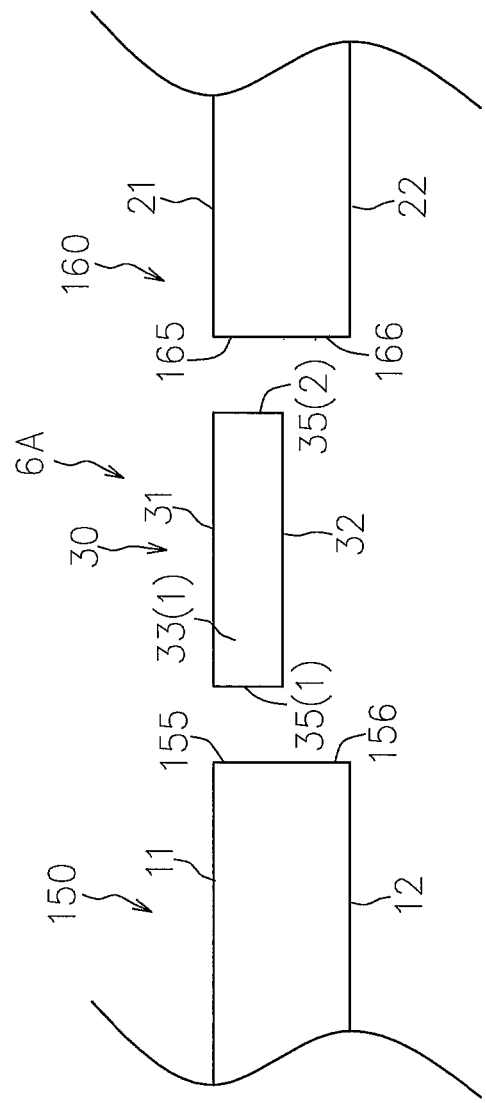
FIG.10A
FIG.10B

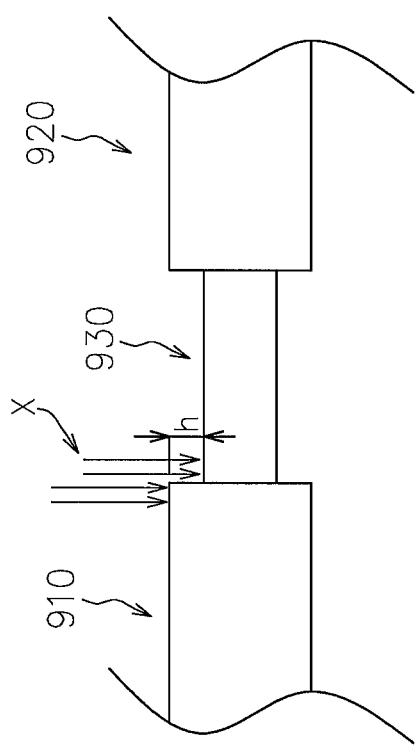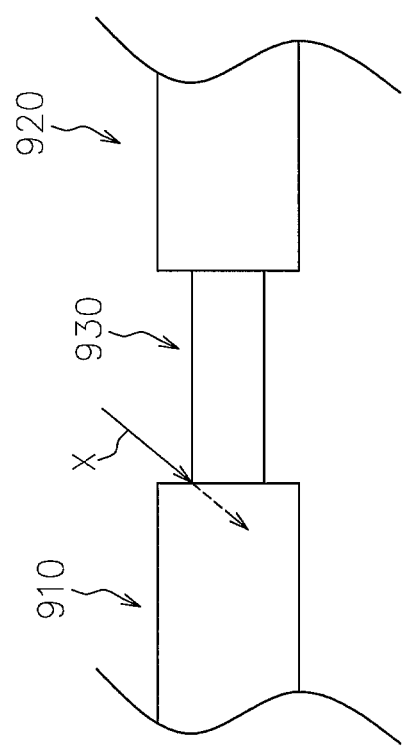
FIG.11A
FIG.11B

US 10,786,864 B2

METHOD FOR MANUFACTURING SHUNT RESISTOR

FIELD OF THE INVENTION

The present invention relates to a method for manufacturing a shunt resistor.

BACKGROUND ART

The shunt resistor is a component having a resistance alloy plate member and first and second conductors which are individually joined to both sides of the resistance alloy plate member, in which the value of resistance between the first and second conductors is set to a predetermined value beforehand.

The shunt resistor is connected in series to an electric circuit which is a current value detection target in order to detect the current value of the circuit by measuring a voltage value between the first and second conductors in the shunt resistor.

When the shunt resistor is used, it is preferable to suppress the temperature increase of the shunt resistor as much as possible.

More specifically, when the temperature of the shunt resistor excessively increases, there is a possibility that the actual value of resistance of the shunt resistor fluctuates from the predetermined value of resistance set beforehand and/or other members located near the resistance alloy plate member are adversely affected.

In particular, when the shunt resistor is utilized in electric devices in which a large current flows, such a bus ring (bus bar) in rotary electric motors, such a problem is likely to arise.

With respect to this point, by setting the plate thickness of the first and second conductors larger than the plate thickness of the resistance alloy plate member, heat generated in the resistance alloy plate member when the shunt resistor is energized can be effectively radiated from the conductors.

The shunt resistor of such a configuration is described in Patent Literature 1 described below.

However, in the shunt resistor in which the joining surfaces of first and second conductors which have a rectangular shape and in which the plate thickness is set large and the joining surfaces of a resistance alloy plate member which have a rectangular shape and in which the plate thickness is set small are merely butted as described in Patent Literature 1 above (hereinafter referred to as a conventional configuration), when the joining surfaces of first and second conductors 910, 920 and the joining surfaces of a resistance alloy plate member 930 are welded by electron beams or a laser as illustrated in FIG. 11A, a situation arises in which electron beams or a laser X are/is emitted to only corner portions of the first and second conductors 910, 920 in which the plate thickness is set large and/or the electron beams or the laser X are/is emitted to only the resistance alloy plate member 930, so that the first and second conductors 910, 920 and the resistance alloy plate member 930 cannot be stably welded.

In particular, as a plate thickness difference h between the first and second conductors 910, 920 and the resistance alloy plate member 930 is larger, the inconvenience is more likely to arise.

In the conventional configuration, as illustrated in FIG. 11B, when the electron beams or the laser X are/is "obliquely" emitted to the upper end edges of a region where the joining surfaces of the conductors 910, 920 and the joining surfaces of the resistance alloy plate member 930 abut on each other, the situation in which the electron beams or the laser X are/is emitted to only the corner portions of the conductors 910, 920 in which the plate thickness is set large and/or the electron beams or the laser X are/is emitted to only the resistance alloy plate member 930 can be avoided. However, according to this method, the abutting portion of the joining surfaces of the conductors 910, 920 and the joining surfaces of the resistance alloy plate member 930 cannot be melted by the electron beams or the laser X, so that the conductors 910, 920 and the resistance alloy plate member 930 cannot be effectively joined to each other.

PRIOR ART DOCUMENT

Patent Literature

Patent Literature 1; JP 2008-039571

DISCLOSURE OF THE INVENTION

The present invention has been made in view of such a conventional technique. It is an object of the present invention to provide a method for manufacturing a shunt resistor which has a resistance alloy plate member and first and second conductors joined to both sides of the resistance alloy plate member, which can efficiently radiate heat generated in the resistance alloy plate member in energization, and in which the junction state between the conductors and the resistance alloy plate member is stabilized.

In order to achieve the object, a first aspect of the present invention provides a manufacturing method of shunt resistor that includes a resistance alloy plate member and first and second conductors respectively joined to one side and the other side in the current flow direction of the resistance alloy plate member, including a step of providing a resistance alloy plate member that has resistance-alloy-side first and second joining surfaces respectively arranged on one side and the other side in the current flow direction; a step of providing a first conductor that has a first-conductor-side joining surface on a side facing the resistance alloy plate member; a step of providing a second conductor that has a second-conductor-side joining surface on a side facing the resistance alloy plate member; a first conductor welding process of causing the first-conductor-side joining surface and the resistance-alloy-side first joining surface to abut on each other in a state where the edges on one side in the plate thickness direction thereof are positioned at the same position in the plate thickness direction, and then emitting electron beams or laser to the joining surfaces in the abutted state from one side in the plate thickness direction to weld the joining surfaces; a second conductor welding process of causing the second-conductor side joining surface and the resistance-alloy-side second joining surface to abut on each other in a state where the edges on one side in the plate thickness direction thereof are positioned at the same position in the thickness direction, and then emitting electron beams or laser to the joining surfaces in the abutted state from one side in the plate thickness direction to weld the joining surfaces; wherein at least one of the first and second conductors has a plate thickness larger than that of the resistance alloy plate member; and wherein the conductor having the plate thickness larger than that of the resistance alloy plate member includes a first inclined surface that is gradually located on one side in the plate thickness direction from the edge on one side in the plate thickness direction of the corresponding joining surface toward the side opposite to the resistance alloy plate member with respect to the plate surface direction, and a first plate surface that extends to the side opposite to the resistance alloy plate member with respect to the plate surface direction from the edge on one side in the plate thickness direction of the first inclined surface.

The manufacturing method of shunt resistor according to the first aspect of the present invention makes it possible to efficiently manufacture a shunt resistor that can improve a radiation property for heat generated in the resistance alloy plate member and stabilize welding state between the resistance alloy plate member and the first and second conductors.

In one embodiment of the first aspect, both of the first and second conductors have the plate thickness larger than that of the resistance alloy plate member. The first and second conductors each may include, in addition to the first inclined surface and the first plate surface, a second inclined surface that is gradually located on the other side in the plate thickness direction from the edge on the other side in the plate thickness direction of the corresponding joining surfaces toward the side opposite to the resistance alloy plate member with respect to the plate surface direction, and a second plate surface that extends to the side opposite to the resistance alloy plate member with respect to the plate surface direction from the edge on the other side in the plate thickness direction of the second inclined surface.

In another embodiment of the first aspect, both of the first and second conductors have the plate thickness larger than that of the resistance alloy plate member. The first and second conductors each may include, in addition to the first inclined surface and the first plate surface, a second plate surface that extends to the side opposite to the resistance alloy plate member with respect to the plate surface direction from the edge on the other side in the plate thickness direction of the corresponding joining surface so that the second plate surface is flush with a plate surface of the resistance alloy plate member that faces in the other side in the plate thickness direction.

In order to achieve the object, a second aspect of the present invention provides a manufacturing method of shunt resistor that includes a resistance alloy plate member and first and second conductors respectively joined to one side and the other side in the current flow direction of the resistance alloy plate member, including a step of providing a resistance alloy plate member that has resistance-alloy-side first and second joining surfaces respectively arranged on one side and the other side in the current flow direction; a step of providing a first conductor that has a first-conductor-side joining surface on a side facing the resistance alloy plate member; a step of providing a second conductor that has a second-conductor-side joining surface on a side facing the resistance alloy plate member; a first conductor welding process of causing the first-conductor-side joining surface and the resistance-alloy-side first joining surface to abut on each other in a state where the edges on one side in the plate thickness direction thereof are positioned at the same position in the plate thickness direction, and then emitting electron beams or laser to the joining surfaces in the abutted state from one side in the plate thickness direction to weld the joining surfaces; a second conductor welding process of causing the second-conductor-side joining surface and the resistance-alloy-side second joining surface to abut on each other in a state where the edges on one side in the plate thickness direction thereof are positioned at the same position in the thickness direction, and then emitting electron beams or laser to the joining surfaces in the abutted state from one side in the plate thickness direction to weld the joining surfaces; wherein at least one of the first and second conductors has a plate thickness larger than that of the resistance alloy plate member; wherein the conductor having the plate thickness larger than that of the resistance alloy plate member includes a first plate-surface-direction extending surfaces that extends from the edges on one side in the plate thickness direction of the corresponding joining surfaces to the side opposite to the resistance alloy plate member with respect to the plate surface direction, a first plate-thickness-direction extending surface that extends from the edge of the first plate-surface-direction extending surface on the side opposite to the resistance alloy plate member with respect to the plate surface direction to one side in the plate thickness direction, and a first plate surface that extends to the side opposite to the resistance alloy plate member with respect to the plate surface direction from the edge on one side of the first plate-thickness-direction extending surface in the plate thickness direction, and wherein when the spot diameter of the electron beam or the laser is defined as a, a plate-surface-direction length L of the plate-surface-direction extending surface is set to $a/2 \leq L \leq 3a/2$.

The manufacturing method of shunt resistor according to the second aspect of the present invention makes it possible to efficiently manufacture a shunt resistor that can improve a radiation property for heat generated in the resistance alloy plate member and stabilize welding state between the resistance alloy plate member and the first and second conductors.

In order to achieve the object, a third aspect of the present invention provides a manufacturing method of shunt resistor that includes a resistance alloy plate member and first and second conductors respectively joined to one side and the other side in the current flow direction of the resistance alloy plate member, including a step of providing a resistance alloy plate member that has resistance-alloy-side first and second joining surfaces respectively arranged on one side and the other side in the current flow direction; a step of providing a first conductor that has a first-conductor-side joining surface on a side facing the resistance alloy plate member; a step of providing a second conductor that has a second-conductor-side joining surface on a side facing the resistance alloy plate member; a first conductor welding process of causing the first-conductor-side joining surface and the resistance-alloy-side first joining surface to abut on each other, and then emitting electron beams or laser to the joining surfaces in the abutted state from one side in the plate thickness direction to weld the joining surfaces; a second conductor welding process of causing the second-conductor side joining surface and the resistance-alloy-side second joining surface to abut on each other, and then emitting electron beams or laser to the joining surfaces in the abutted state from one side in the plate thickness direction to weld the joining surfaces; wherein at least one of the first and second conductors has a plate thickness larger than that of the resistance alloy plate member; wherein the joining surface of the conductor having the plate thickness larger than that of the resistance alloy plate member is formed into an inclined joining surface that is gradually located on the side opposite to the resistance alloy plate member with respect to the plate surface direction from one side toward the other side in the plate thickness direction; wherein the conductor having the plate thickness larger than that of the resistance alloy plate member includes a first plate-thickness-direction extending surface that extends from the edge of the inclined joining surface on one side in the plate thickness direction to one side in the plate thickness direction, and a first plate surface extending from the edge of the first plate-thickness-direction extending surface on one side in the plate thickness direction to the side opposite to the resistance alloy plate member with respect to the plate surface direction; wherein the joining surface joined to the conductor having a larger plate thickness, out of the resistance-alloy-side first and second joining surfaces, is formed into an inclined joining surface corresponding to the inclined joining surface of the conductor having a larger plate thickness; and wherein, in the welding process in which the joining surfaces to be welded are the inclined joining surfaces, out of the first conductor welding process and the second conductor welding process, the emission direction of the electron beams or the laser is set along the inclined joining surfaces.

The manufacturing method of shunt resistor according to the third aspect of the present invention makes it possible to efficiently manufacture a shunt resistor that can improve a radiation property for heat generated in the resistance alloy plate member and stabilize welding state between the resistance alloy plate member and the first and second conductors.

In order to achieve the object, a fourth aspect of the present invention provides a manufacturing method of shunt resistor that includes a resistance alloy plate member and first and second conductors respectively joined to one side and the other side in the current flow direction of the resistance alloy plate member, including a step of providing a resistance alloy plate member that has resistance-alloy-side first and second joining surfaces respectively arranged on one side and the other side in the current flow direction; a step of providing a first conductor that has a first-conductor-side joining surface on a side facing the resistance alloy plate member; a step of providing a second conductor that has a second-conductor-side joining surface on a side facing the resistance alloy plate member; a first conductor welding process of causing the first-conductor-side joining surface and the resistance-alloy-side first joining surface to abut on each other, and then emitting electron beams or laser to the joining surfaces in the abutted state from one side in the plate thickness direction to weld the joining surfaces; a second conductor welding process of causing the second-conductor side joining surface and the resistance-alloy-side second joining surface to abut on each other, and then emitting electron beams or laser to the joining surfaces in the abutted state from one side in the plate thickness direction to weld the joining surfaces; wherein at least one of the first and second conductors has a plate thickness larger than that of the resistance alloy plate member; wherein the joining surface of the conductor having the plate thickness larger than that of the resistance alloy plate member includes a first inclined region that is gradually located on the side opposite to the resistance alloy plate member with respect to the plate surface direction from one side toward the other side in the plate thickness direction, and a second inclined region that is gradually located on a side approaching the resistance alloy plate member with respect to the plate surface direction from the edge on the other side in the plate thickness direction of the first inclined region toward the other side in the plate thickness direction; wherein the conductor having the plate thickness larger than that of the resistance alloy plate member includes a first plate-thickness-direction extending surface that extends from the edge on one side in the plate thickness direction of the first inclined region to one side in the plate thickness direction, a first plate surface that extends from the edge on one side in the plate thickness direction of the first plate-thickness-direction extending surface to the side opposite to the resistance alloy plate member with respect to the plate surface direction, a second plate-thickness-direction extending surface that extends from the edge on the other side in the plate thickness direction of the second inclined region to the other side in the plate thickness direction, and a second plate surface that extends from the edge on the other side in the plate thickness direction of the second plate-thickness-direction extending surface to the side opposite to the resistance alloy plate member with respect to the plate surface direction; wherein the joining surface joined to the conductor having a larger plate thickness, out of the resistance-alloy-side first and second joining surfaces, includes first and second inclined regions respectively corresponding to the first and second inclined regions of the conductor having a larger plate thickness; and wherein a welding process in which the joining surfaces to be welded have the first and second inclined regions, out of the first conductor welding process and the second conductor welding process, includes a welding process on one side in the plate thickness direction of emitting the electron beams or the laser from one side in the plate thickness direction to the first inclined regions in a state where the emission direction is set along the first inclined regions to weld the first inclined regions, and a welding process on the other side in the plate thickness direction of emitting the electron beams or the laser from the other side in the plate thickness direction to the second inclined regions in a state where the emission direction is set along the second inclined regions to weld the second inclined regions.

The manufacturing method of shunt resistor according to the fourth aspect of the present invention makes it possible to efficiently manufacture a shunt resistor that can improve a radiation property for heat generated in the resistance alloy plate member and stabilize welding state between the resistance alloy plate member and the first and second conductors.

In order to achieve the object, a fifth aspect of the present invention provides a manufacturing method of shunt resistor that includes a resistance alloy plate member and first and second conductors respectively joined to one side and the other side in the current flow direction of the resistance alloy plate member, including a step of providing a resistance alloy plate member that has resistance-alloy-side first and second joining surfaces respectively arranged on one side and the other side in the current flow direction;

a step of providing a first conductor that has a first-conductor-side joining surface on a side facing the resistance alloy plate member; a step of providing a second conductor that has a second-conductor-side joining surface on a side facing the resistance alloy plate member; a first conductor welding process of causing the first-conductor-side joining surface and the resistance-alloy-side first joining surface to abut on each other in a state where the edges on one side in the plate thickness direction thereof are positioned at the same position in the plate thickness direction, and then emitting electron beams or laser to the joining surfaces in the abutted state from one side in the plate thickness direction to weld the joining surfaces; a second conductor welding process of causing the second-conductor-side joining surface and the resistance-alloy-side second joining surface to abut on each other in a state where the edges on one side in the plate thickness direction thereof are positioned at the same position in the thickness direction, and then emitting electron beams or laser to the joining surfaces in the abutted state from one side in the plate thickness direction to weld the joining surfaces; and wherein at least one of the first and second conductors is wider than the resistance alloy plate member.

The manufacturing method of shunt resistor according to the fifth aspect of the present invention makes it possible to efficiently manufacture a shunt resistor that can improve a radiation property for heat generated in the resistance alloy plate member and stabilize welding state between the resistance alloy plate member and the first and second conductors.

In a preferable configuration of the fifth aspect of the present invention, at least one of the first and second conductors may have the plate thickness larger than that of the resistance alloy plate member, and the conductor having the plate thickness larger than that of the resistance alloy plate member may include a first inclined surface that is gradually located on one side in the plate thickness direction from the edge on one side in the plate thickness direction of the corresponding joining surface to the side opposite to the resistance alloy plate member with respect to the plate surface direction, and a first plate surface that extends to the side opposite to the resistance alloy plate member with respect to the plate surface direction from the edge on one side in the plate thickness direction of the first inclined surface.

In order to achieve the object, a sixth aspect of the present invention provides a manufacturing method of shunt resistor that includes a resistance alloy plate member and first and second conductors respectively joined to one side and the other side in the current flow direction of the resistance alloy plate member, including a step of providing a resistance alloy plate member that has resistance-alloy-side first and second joining surfaces respectively arranged on one side and the other side in the current flow direction; a step of providing a first conductor that has a first-conductor-side joining surface on a side facing the resistance alloy plate member; a step of providing a second conductor that has a second-conductor-side joining surface on a side facing the resistance alloy plate member; a first conductor welding process of causing the first-conductor-side joining surface and the resistance-alloy-side first joining surface to abut on each other, and then emitting electron beams or laser to the joining surfaces in the abutted state to weld the joining surfaces; a second conductor welding process of causing the second-conductor-side joining surface and the resistance-alloy-side second joining surface to abut on each other, and then emitting electron beams or laser to the joining surfaces in the abutted state to weld the joining surfaces; wherein at least one of the first and second conductors has a plate thickness larger than that of the resistance alloy plate member; wherein the conductor having the plate thickness larger than that of the resistance alloy plate member includes a first plate surface that extends from the edge of the corresponding joining surface on one side in the plate thickness direction to the side opposite to the resistance alloy plate member with respect to the plate surface direction, an extending surface that extends to the other side in the plate thickness direction from the edge of the corresponding joining surface on other side in the plate thickness direction, and a second plate surface that extends from the edge of the extending surface on the other side in the plate thickness direction to the side opposite to the resistance alloy plate member with respect to the plate surface direction; and wherein the welding process in which the conductor having the plate thickness larger than that of the resistance alloy plate member is welded to the resistance alloy plate member, out of the first conductor welding process and the second conductor welding process, causes the joining surfaces of the corresponding conductor and the resistance alloy plate member to abut on each other in a state where the edges on one side in the plate thickness direction thereof are positioned at the same position in the thickness direction, and then emits electron beams or laser to the joining surfaces in the abutted state from one side in the plate thickness direction to weld the joining surfaces.

The manufacturing method of shunt resistor according to the sixth aspect of the present invention makes it possible to efficiently manufacture a shunt resistor that can improve a radiation property for heat generated in the resistance alloy plate member and stabilize welding state between the resistance alloy plate member and the first and second conductors.

BRIEF DESCRIPTION OF THE DRAWINGS

FIGS. 10A and 10B are a side view and an exploded side view, respectively, of a shunt resistor manufactured by a manufacturing method according to a sixth embodiment of the present invention.

FIGS. 11A and 11B are side views of shunt resistors manufactured by manufacturing methods according to first and second prior art, respectively.

EMBODIMENT FOR CARRYING OUT THE INVENTION

Embodiment 1

Hereinafter, one embodiment of a method for manufacturing a shunt resistor according to the present invention is described with reference to the accompanying drawings.

Figure 1:
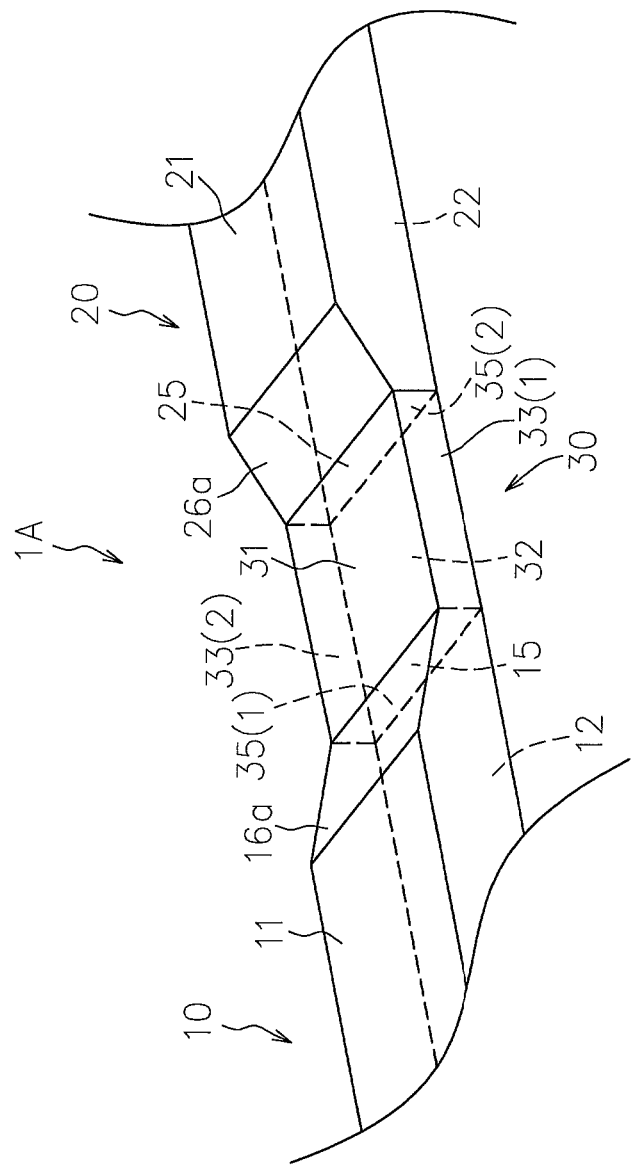
FIG. 1 is a perspective view of a shunt resistor manufactured by a manufacturing method according to a first embodiment of the present invention.

FIG. 1 illustrates a perspective view of a shunt resistor 1A manufactured by the manufacturing method according to this embodiment.

Figures 2A, 2B:
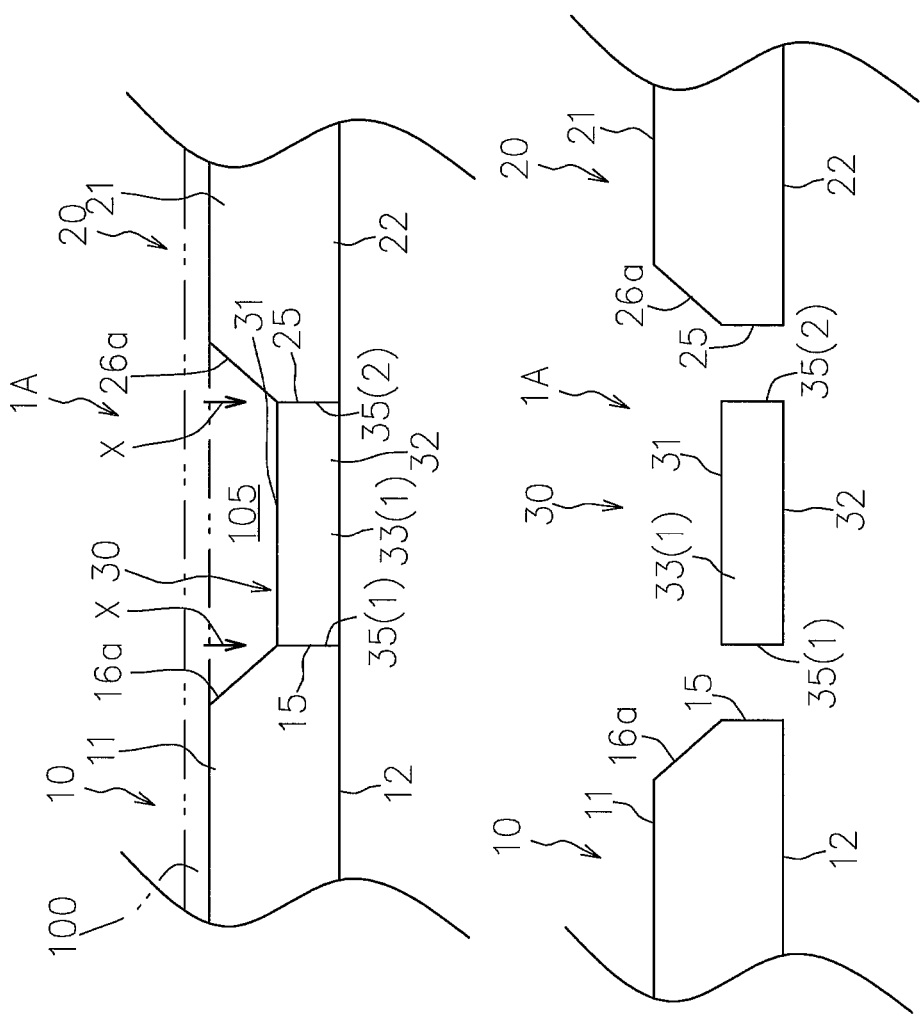
FIGS. 2A and 2B are a side view and an exploded side view, respectively, of the shunt resistor shown in FIG. 1A.

FIGS. 2A and 2B illustrate a side view and an exploded side view, respectively, of the shunt resistor 1A.

As illustrated in FIG. 1, FIG. 2A, and FIG. 2B, the shunt resistor 1A has a resistance alloy plate member 30 and first and second conductors 10, 20 which are respectively joined to one side and the other side in the current flow direction of the resistance alloy plate member 30.

The first and second conductors 10, 20 are formed of a conductive member and, for example, a Cu metal plate member is preferably used.

The first and second conductors 10, 20 are provided with a pair of detection terminals (not illustrated) that are located near the resistance alloy plate member 20 connecting the first and second conductors 10, 20 or an electric circuit plate 100 (indicated by the chain double-dashed imaginary line in FIG. 2A) electrically connecting the first and second conductors 10, 20.

The resistance alloy plate member 30 is a member mechanically and electrically connecting the first and second conductors 10, 20 and the value of resistance is set so that the value of resistance between the pair of first and second conductors 10, 20 is a desired value of resistance.

For the resistance alloy plate member 30, a Cu—Mn-based alloy, a Ni—Cr-based alloy, and a Cu—Ni-based alloy are preferably used, for example.

The first and second conductors 10, 20 and the resistance alloy plate member 30 are joined to each other by emitting, in a state where the joining surfaces are caused to abut on each other, electron beams or a laser X (refer to FIG. 2A) to the joining surfaces to weld the joining surfaces.

In detail, as illustrated in FIG. 1, FIG. 2A, and FIG. 2B, the resistance alloy plate member 30 has a resistance-alloy-side first joining surface 35(1) directed to the first conductor 10 located on one side in the current flow direction in current value measurement of the shunt resistor 1A and a resistance-alloy-side second joining surface 35(2) directed to the second conductor 20 located on the other side in the current flow direction.

In this embodiment, the resistance alloy plate member 30 is formed into a rectangular shape.

More specifically, the resistance alloy plate member 30 has, in addition to the resistance-alloy-side first and second joining surfaces 35(1), 35(2), a first plate surface 31 connecting the upper end edges of the resistance-alloy-side first and second joining surfaces 35(1), 35(2) and directed to one side in the plate thickness direction, a second plate surface 32 connecting the lower end edges of the resistance-alloy-side first and second joining surfaces 35(1), 35(2) and directed to the other side in the plate thickness direction, a first side surface 33(1) connecting the edges on one side in the width direction of the resistance-alloy-side first and second joining surfaces 35(1), 35(2), and a second side surface 33(2) connecting the edges on the other side in the width direction of the resistance-alloy-side first and second joining surfaces 35(1), 35(2).

The first conductor 10 has a first-conductor-side joining surface 15 on a side facing the resistance alloy plate member 30.

The first conductor 10 is connected to the resistance alloy plate member 30 through a first conductor welding process in which both the joining surfaces 15, 35(1) are joined by welding by the electron beams or the laser X to be emitted from one side in the plate thickness direction in a state where the first-conductor-side joining surface 15 is caused to abut on the resistance-alloy-side first joining surface 35(1).

Similarly, the second conductor 20 has a second-conductor-side joining surface 25 on a side facing the resistance alloy plate member 30.

The second conductor 20 is connected to the resistance alloy plate member 30 through a second conductor welding process in which both the joining surfaces 25 and 35(2) are joined by welding by the electron beams or the laser X to be emitted from one side in the plate thickness direction in a state where the second-conductor-side joining surface 25 is caused to abut on the resistance-alloy-side second joining surface 35(2).

The shunt resistor 1A is desired to be improved in the radiation properties of heat generated in the resistance alloy plate member 30 in use.

More specifically, the shunt resistor 1A is a member to be interposed in an electric circuit serving as a current value measurement target. The shunt resistor 1A is also energized when the electric circuit is energized, so that the resistance alloy plate member 30 generates heat.

When the resistance alloy plate member 30 excessively generates heat, there is a possibility that the value of resistance of the resistance alloy plate member 30 changes from a predetermined preset value and/or the melting of other members located near the resistance alloy plate member 30 is caused. Therefore, it is demanded to increase the heat radiation properties of the resistance alloy plate member 30.

Herein, when at least either one of the first and second conductors 10, 20 is configured so as to have a large surface area in a portion adjacent to the corresponding joining surface, the heat generated in the resistance alloy plate member 30 can be efficiently radiated through the portion.

An increase in the surface area of the portion adjacent to the corresponding joining surface can be achieved by setting the plate thickness of the corresponding first and/or second conductors 10, 20 to be larger than the plate thickness of the resistance alloy plate member 30, for example.

In this embodiment, the plate thickness of both the first and second conductors 10, 20 is set larger than the plate thickness of the resistance alloy plate member 30 as illustrated in FIG. 1, FIG. 2A, and FIG. 2B.

When the plate thickness of either or both the first or/and second conductors 910, 920 is set larger than the plate thickness of the resistance alloy plate member 930 as illustrated in FIG. 11A, it becomes difficult to appropriately emit the electron beams or the laser X to the joining surfaces of the conductors 910, 920 and the joining surfaces of the resistance alloy plate member 930 which are caused to abut on each other in a state where the emission direction is parallel to the joining surfaces. Thus, a situation arises in which the electron beams or the laser X are/is emitted to only corner portions of the first and/or second conductors 910, 920 in which the plate thickness is set large and/or the electron beams or the laser X are/is emitted only to the vicinity of the joining surfaces of the resistance alloy plate member 930, so that the welding between the first and second conductors 910, 920 and the resistance alloy plate member 930 cannot be stably performed.

With respect to this point, in this embodiment, the conductors 10, 20 in which the plate thickness is set larger than that of the resistance alloy plate member 30 are configured so as to have first inclined surfaces 16a, 26a located on one side in the plate thickness direction which is the side of the emission source of the electron beams or the laser X from the edges on one side in the plate thickness direction of the corresponding joining surfaces 15, 25 toward the side opposite to the resistance alloy plate member 30 with respect to the plate surface direction (side separating from the resistance alloy plate member 30 with respect to the plate surface direction). In the conductors 10, 20 having the plate thickness larger than that of the resistance alloy plate member 30, first plate surfaces 11, 21 directed to one side in the plate thickness direction extend to the side opposite to the resistance alloy plate member 30 with respect to the plate surface direction from the edges on one side in the plate thickness direction of the first inclined surfaces 16a, 26a so that the first plate surfaces 11, 21 are located on one side in the plate thickness direction relative to the first plate surface 31 of the resistance alloy plate member 30.

As described above, the plate thickness of both the first and second conductors 10, 20 is set larger than the plate thickness of the resistance alloy plate member 30 in this embodiment.

Therefore, the first conductor 10 is provided with the first inclined surface 16a between the first-conductor-side joining surface 15 and the first plate surface 11 of the first conductor 10, the first inclined surface 16a being configured so as to be located on one side in the plate thickness direction from the edge on one side in the plate thickness direction of the first-conductor-side joining surface 15 toward the side opposite to the resistance alloy plate member 30 with respect to the plate surface direction and reach the first plate surface 11.

Similarly, the second conductor 20 is provided with the first inclined surface 26a between the second-conductor-side joining surface 25 and the first plate surface 21 of the second conductor 20, the first inclined surface 26a being configured so as to be located on one side in the plate thickness direction from the edge on one side in the plate thickness direction of the second-conductor-side joining surface 25 toward the side opposite to the resistance alloy plate member 30 with respect to the plate surface direction and reach the second plate surface 21.

According to such a configuration, the electron beams or the laser X can be appropriately emitted to the abutting portion of the joining surfaces of the conductors 10, 20 having a large plate thickness and the corresponding joining surfaces of the resistance alloy plate member 30 in the state where the emission direction is parallel to the joining surfaces as illustrated in FIG. 2A while setting the plate thickness of the first and/second conductors 10, 20 to be larger than the plate thickness of the resistance alloy plate member 30.

Therefore, the shunt resistor 1A in which the heat radiation properties of the resistance alloy plate member 30 are improved by setting the plate thickness of the first conductor 10 and/or the second conductor 20 (both the first and second conductors 10, 20 in this embodiment) to be larger than the plate thickness of the resistance alloy plate member 30 can be efficiently manufactured in a state where the welding between the first and second conductors 10, 20 and the resistance alloy plate member 30 is stabilized.

In the shunt resistor 1A of such a configuration, a space 105 can be secured between the resistance alloy plate member 30 where the temperature is the highest and the electric circuit plate 100 even when the electric circuit plate 100 (indicated by the chain double-dashed imaginary line in FIG. 2A) is disposed over between the first and second conductors 10, 20.

Therefore, the occurrence of a problem in the electric circuit plate 100 by the heat from the resistance alloy plate member 30 can be effectively prevented.

Moreover, by giving an air current to the space 105, the shunt resistor 1A containing the electric circuit plate 100 can be positively cooled.

By stabilizing the welding state between the conductors 10, 20 and the resistance alloy plate member 30, the fluctuation of the value of resistance in the joining portion between the conductors 10, 20 and the resistance alloy plate member 30 can be effectively prevented and the yield of the shunt resistor 1A can be improved.

In this embodiment, second plate surfaces 12, 22 directed to the other side in the plate thickness direction of the first and second conductors 10, 20 are flush with the second plate surface 32 of the resistance alloy plate member 30 as illustrated in FIGS. 2A and 2B.

According to such a configuration, when welding the first and second conductors 10, 20 and the resistance alloy plate member 30, the positioning of the first and second conductors 10, 20 and the resistance alloy plate member 30 can be easily performed.

Figure 3:
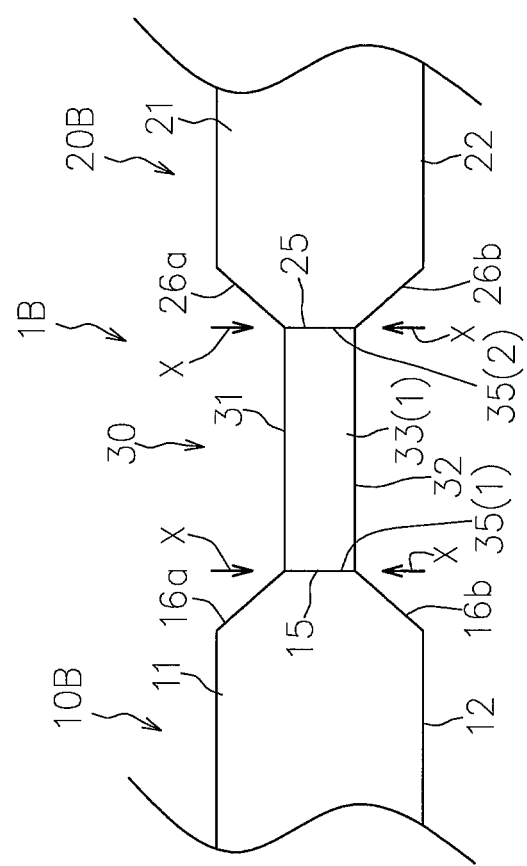
FIG. 3 is a partial side view of a shunt resistor according to a modification of the first embodiment.

FIG. 3 illustrates a partial side view of a shunt resistor 1B according to a modification of this embodiment.

In the modification illustrated in FIG. 3, conductors (both first and second conductors 10B and 20B in the embodiment illustrated in the figure) in which the plate thickness is set larger than that of the resistance alloy plate member 30 are configured so as to have, in addition to the first inclined surfaces 16a, 26a, second inclined surfaces 16b, 26b between the corresponding joining surfaces 15, 25 and the second plate surfaces 12, 22. The second inclined surfaces 16b, 26b are configured so as to be located on the other side in the plate thickness direction from the edges on the other side in the plate thickness direction of the joining surfaces 15, 25 toward the side opposite to the resistance alloy plate member 30 with respect to the plate surface direction and reach the second plate surfaces 12, 22.

According to such a configuration, the radiation properties of the heat generated in the resistance alloy plate member 30 can be further improved while stabilizing the welding state between the first and second conductors 10B and 20B and the resistance alloy plate member 30.

According to the shunt resistor 1B, the electron beams or the laser X can also be emitted to the abutting portions of the joining surfaces 15, 25 of the first and second conductors 10B and 20B and the joining surfaces 35(1), 35(2) of the resistance alloy plate member 30 from the other side in the plate thickness direction.

Embodiment 2

Hereinafter, another embodiment of the method for manufacturing a shunt resistor according to the present invention is described with reference to the accompanying drawings.

Figures 4A, 4B:
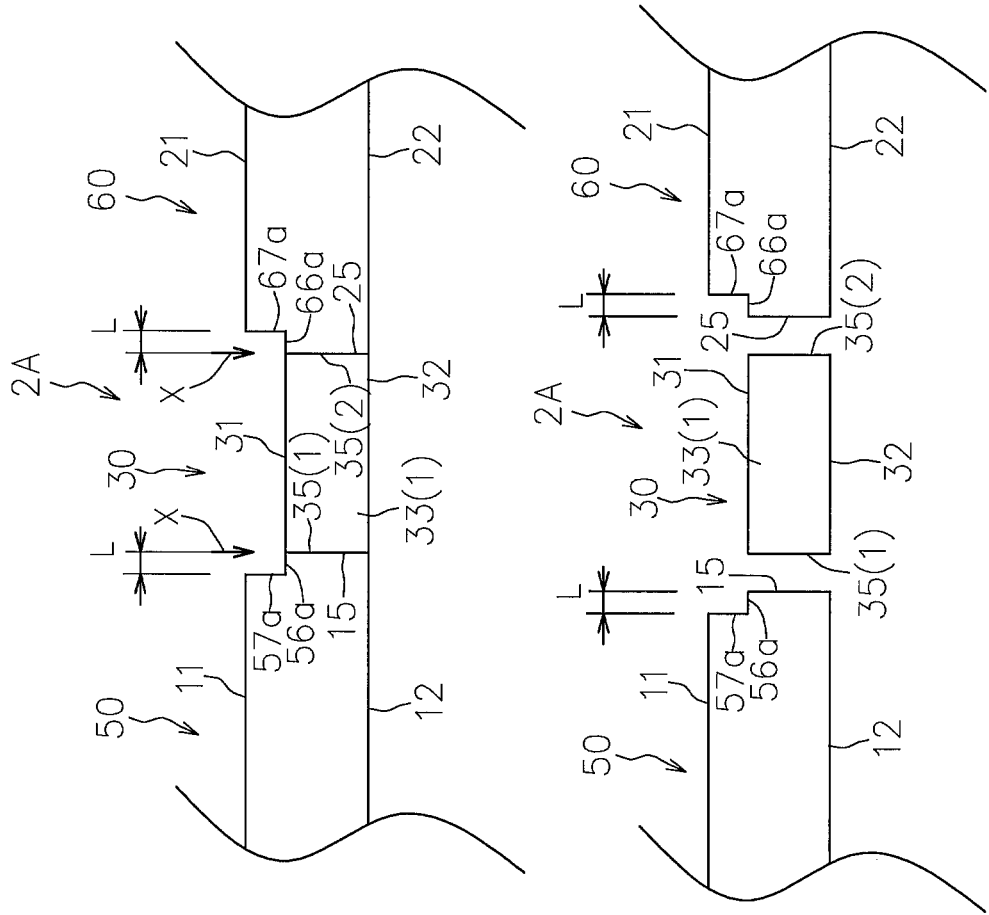
FIGS. 4A and 4B are a side view and an exploded side view, respectively, of a shunt resistor manufactured by a manufacturing method according to a second embodiment of the present invention.

FIGS. 4A and 4B illustrate a side view and an exploded side view, respectively, of a shunt resistor 2A manufactured by the manufacturing method according to this embodiment.

In the figures, the same members as those in Embodiment 1 are designated by the same reference numerals and a description thereof is omitted as appropriate.

The shunt resistor 2A of this embodiment has first and second conductors 50, 60 in place of the first and second conductors 10, 20 as compared with the shunt resistor 1A of Embodiment 1.

The plate thickness of at least either one of the first and second conductors 50, 60 is set larger than the plate thickness of the resistance alloy plate member 30 as with Embodiment 1.

In the embodiment illustrated in the figures, the plate thickness of both the first and second conductors 50, 60 is set larger than the plate thickness of the resistance alloy plate member 30.

As illustrated in FIGS. 4A and 4B, the conductors (both the first and second conductors 50, 60 in this embodiment) in which the plate thickness is set larger than that of the resistance alloy plate member 30 have first plate-surface-direction extending surfaces 56a, 66a extending from the edges on one side in the plate thickness direction of the corresponding joining surfaces 15, 25 to the side opposite to the resistance alloy plate member 30 with respect to the plate surface direction and first plate-thickness-direction extending surfaces 57a, 67a extending from the edges on the side opposite to the resistance alloy plate member 30 with respect to the plate surface direction to one side in the plate thickness direction in the first plate-surface-direction extending surfaces 56a, 66a. In the conductors having the plate thickness larger than that of the resistance alloy plate member 30, the first plate surfaces 11, 21 extend to the side opposite to the resistance alloy plate member 30 with respect to the plate surface direction from the edges on one side in the plate thickness direction of the first plate-thickness-direction extending surfaces 57a, 67a.

Herein, when the spot diameter of the electron beams or the laser X is defined as a, a plate-surface-direction length L of the plate-surface-direction extending surfaces 56a, 66a is set to a/2≤L≤3a/2.

Also in such a configuration, the same effects as those in Embodiment 1 described above are achieved, i.e., the shunt resistor 2A in which the radiation properties of heat generated in the resistance alloy plate member 30 can be improved while stabilizing the welding of the first and second conductors 50, 60 and the resistance alloy plate member 30 can be efficiently manufactured.

In this embodiment, the second plate surfaces 12, 22 in the first and second conductors 50, 60 extend from the edges on the other side in the plate thickness direction of the corresponding joining surfaces 15, 25 to the side opposite to the resistance alloy plate member 30 with respect to the plate surface direction and are flush with the second plate surface 32 of the resistance alloy plate member 30 as illustrated in FIGS. 4A and 4B.

In place of this configuration, the second plate surfaces 12, 22 of the conductors (both the first and second conductors 50, 60 in this embodiment) in which the plate thickness is set larger than that of the resistance alloy plate member 30 can be modified so as to be located on the other side in the plate thickness direction relative to the second plate surface 32 of the resistance alloy plate member 30 as with the modification 1B (FIG. 3) of Embodiment 1.

Figure 5A:
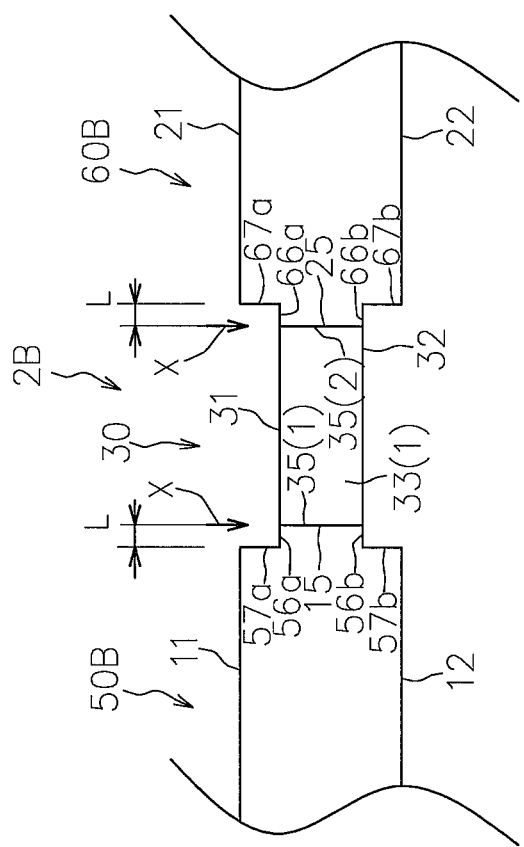
FIGS. 5A and 5B are a side view and an exploded side view, respectively, of a shunt resistor manufactured by a manufacturing method according to a modification of the second embodiment.
Figure 5B:
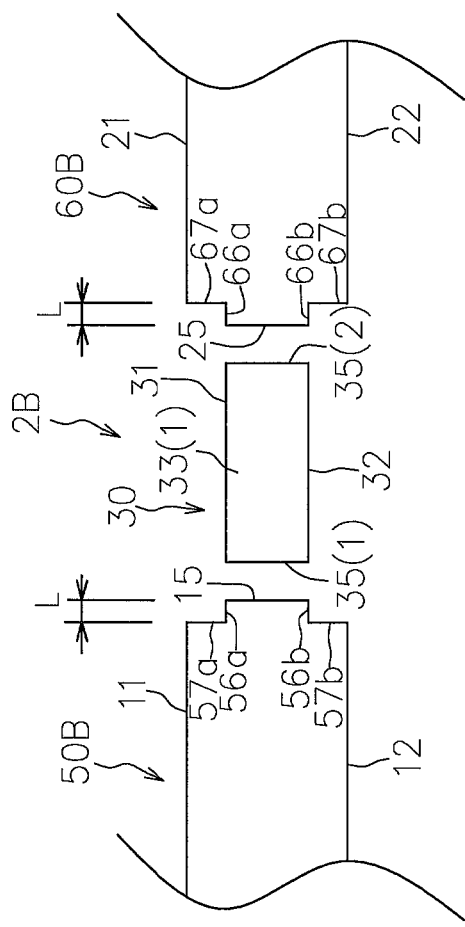

FIGS. 5A and 5B illustrate a side view and an exploded side view, respectively, of a shunt resistor 2B manufactured by a manufacturing method according to a modification of this embodiment.

In the modification illustrated in FIGS. 5A and 5B, conductors (both first and second conductors 50B and 60B in this modification) in which the plate thickness is set larger than that of the resistance alloy plate member 30 have, in addition to the first plate-surface-direction extending surfaces 56a, 66a and the first plate-thickness-direction extending surfaces 57a, 67a, second plate-surface-direction extending surfaces 56b, 66b extending from the edges on the other side in the plate thickness direction of the corresponding joining surfaces 15, 25 to the side opposite to the resistance alloy plate member 30 with respect to the plate surface direction and second plate-thickness-direction extending surfaces 57b, 67b extending from the edges on the side opposite to the resistance alloy plate member 30 with respect to the plate surface direction in the second plate-surface-direction extending surfaces 56b, 66b to the other side in the plate thickness direction. In the conductors having the thickness larger than that of the resistance alloy plate member 30, the second plate surfaces 12, 22 extend from the edges on the other side in the plate thickness direction of the second plate direction extending surfaces 57b, 67b.

According to such a modification 2B, the heat radiation properties of the resistance alloy plate member 30 can be further improved.

Embodiment 3

Hereinafter, still another embodiment of the method for manufacturing a shunt resistor according to the present invention is described with reference to the accompanying drawings.

Figure 6A:
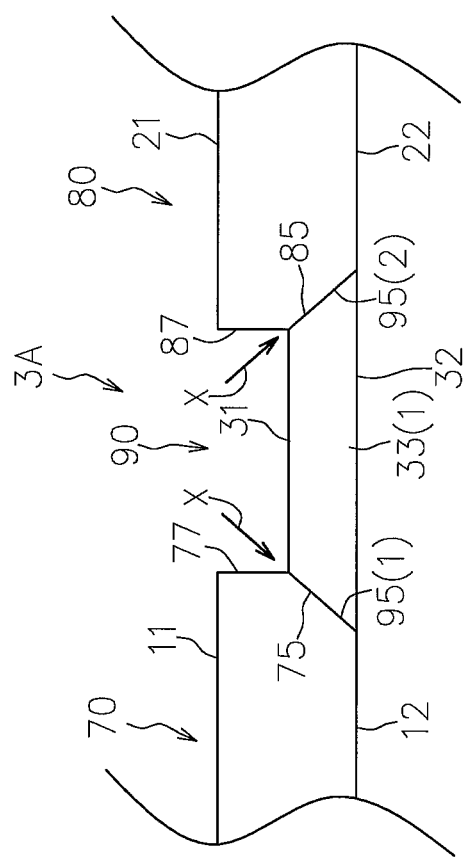
FIGS. 6A and 6B are a side view and an exploded side view, respectively, of a shunt resistor manufactured by a manufacturing method according to a third embodiment of the present invention.
Figure 6B:
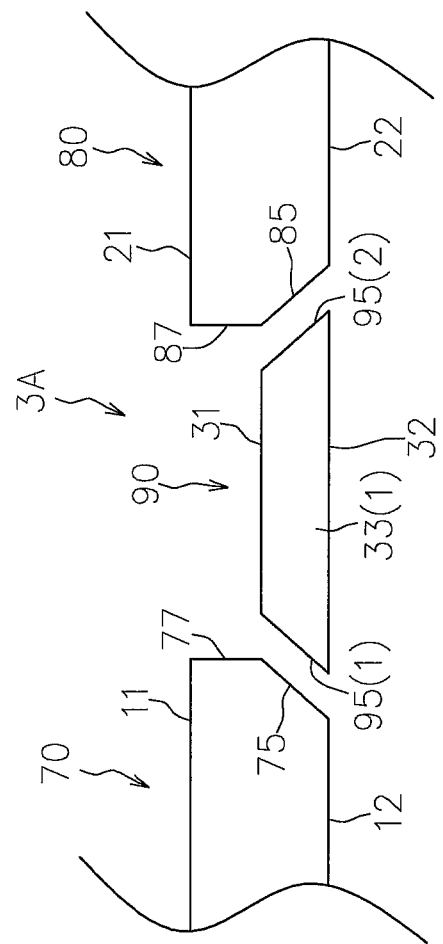

FIGS. 6A and 6B illustrate a side view and an exploded side view, respectively, of a shunt resistor 3A manufactured by the manufacturing method according to this embodiment.

In the figures, the same members as those in Embodiments 1 and 2 are designated by the same reference numerals and a description thereof is omitted as appropriate.

The shunt resistor 3A has a resistance alloy plate member 90 and first and second conductors 70, 80 which are respectively joined to one side and the other side in the current flow direction of the resistance alloy plate member 90.

The plate thickness of at least either one of the first and second conductors 70, 80 is set larger than the plate thickness of the resistance alloy plate member 90 as with Embodiments 1 and 2.

In the embodiment illustrated in the figures, the plate thickness of both the first and second conductors 70, 80 is set larger than the plate thickness of the resistance alloy plate member 90.

As illustrated in FIGS. 6A and 6B, the joining surfaces (a first-conductor-side joining surface 75 and a second-conductor-side joining surface 85 in this embodiment) of the conductors (both the first and second conductors 70, 80 in this embodiment) in which the plate thickness is set larger than that of the resistance alloy plate member 90 are formed into inclined joining surfaces located on the side opposite to the resistance alloy plate member 90 with respect to the plate surface direction from one side toward the other side in the plate thickness direction.

While configured as described above, the conductors (both the first and second conductors 70, 80 in this embodiment) in which the plate thickness is set larger than that of the resistance alloy plate member 90 have first plate-thickness-direction extending surfaces 77 and 87 extending from the edges on one side in the plate thickness direction of the inclined joining surfaces 75 and 85 to one side in the plate thickness direction so that the first plate surfaces 11, 21 of the conductors 70, 80 having a large plate thickness extend from the edges on one side in the plate thickness direction of the first plate-thickness-direction extending surfaces 77 and 87 to the side opposite to the resistance alloy plate member 30 with respect to the plate surface direction.

Meanwhile, the resistance alloy plate member 90 has a resistance-alloy-side first joining surface 95(1) and a resistance-alloy-side second joining surface 95(2) joined to the first and second-conductor-side joining surfaces 75 and 85, respectively, and the joining surfaces joined to the conductors having a large plate thickness out of the resistancealloy-side first and second joining surfaces 95(1), 95(2) are formed into inclined joining surfaces corresponding to the inclined joining surfaces in the conductors having a large plate thickness.

As described above, the plate thickness of both the first and second conductors 70, 80 is set large, and therefore both the resistance-alloy-side first and second joining surfaces 95(1), 95(2) are formed into the inclined joining surfaces in this embodiment.

In the welding process in which both the joining surfaces to be welded are the inclined joining surfaces out of the first conductor welding process and the second conductor welding process, the emission direction of the electron beams or the laser X is set along the inclined joining surfaces.

As described above, both the joining surfaces 75, 95(1) to be welded by the first conductor welding process and the joining surfaces 85, 95(2) to be welded by the second conductor welding process are the inclined joining surfaces in this embodiment.

Therefore, as illustrated in FIG. 6A, in the first conductor welding process, the emission direction of the electron beams or the laser X is set along the inclination directions of the resistance-alloy-side first joining surface 95(1) and the first-conductor-side joining surface 75. On the other hand, in the second conductor welding process, the emission direction of the electron beams or the laser X is set along the inclination directions of the resistance-alloy-side second joining surface 95(2) and the second-conductor-side joining surface 85.

Although the inclination angles to the second plate surfaces 12, 22, 32 of the inclined joining surfaces 75, 95(1) and the inclined joining surfaces 85, 95(2) can fall in various ranges, the inclination angles can be preferably set to 45° or more and less than 90°. When the length along the inclination direction of the joining surfaces is taken into consideration, the inclination angles can be set to 60° or more and 70° or less.

Also in the embodiment of such a configuration, the same effects as those in Embodiments 1 and 2 can be obtained.

In this embodiment, the second plate surfaces 12, 22 of the first and second conductors 70, 80 are flush with the second plate surface 32 of the resistance alloy plate member 90 as illustrated in FIGS. 6A and 6B.

Embodiment 4

Hereinafter, yet still another embodiment of the method for manufacturing a shunt resistor according to the present invention is described with reference to the accompanying drawings.

Figures 7A, 7B:
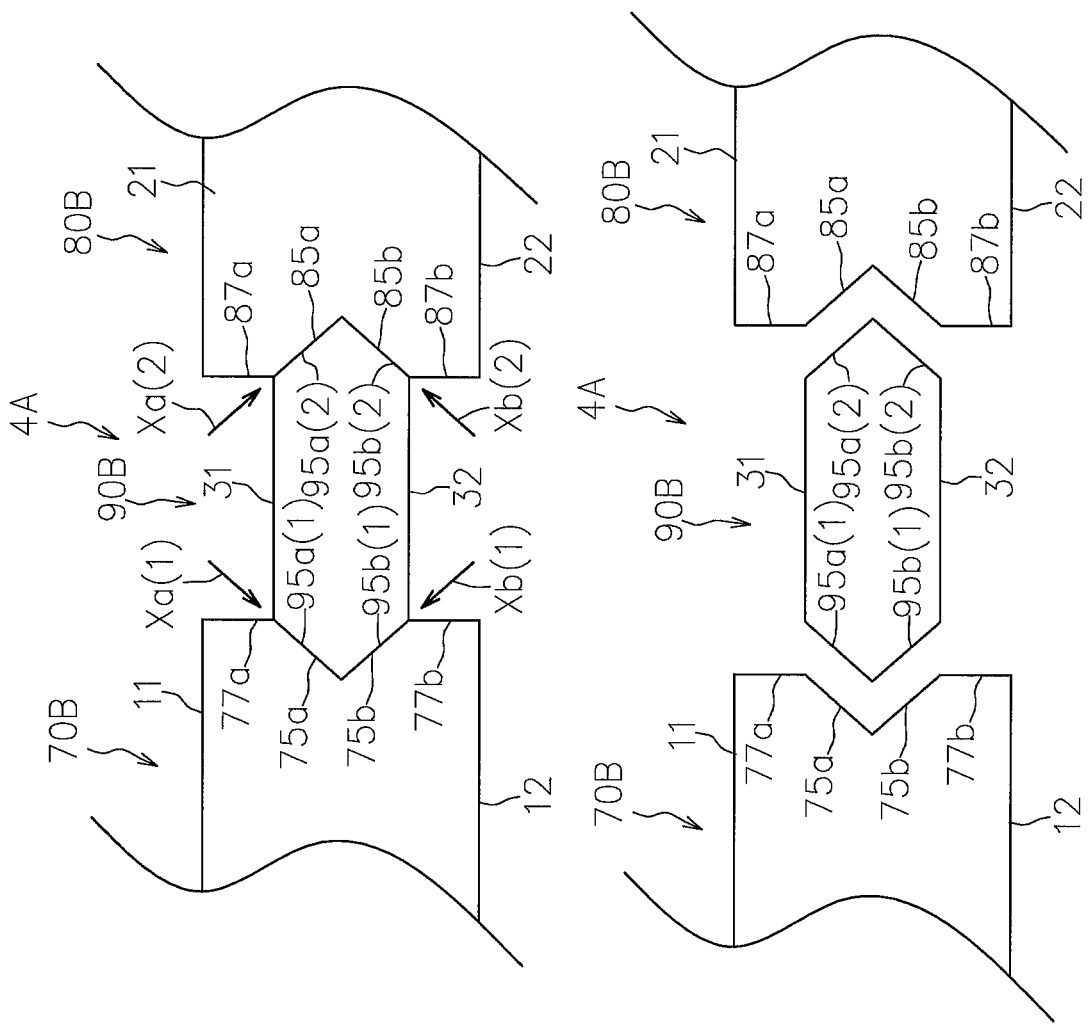
FIGS. 7A and 7B are a side view and an exploded side view, respectively, of a shunt resistor manufactured by a manufacturing method according to a fourth embodiment of the present invention.

FIGS. 7A and 7B illustrate a side view and an exploded side view, respectively, of a shunt resistor 4A manufactured by the manufacturing method according to this embodiment.

In the figures, the same members as those in Embodiments 1 to 3 are designated by the same reference numerals and a description thereof is omitted as appropriate.

The shunt resistor 4A has a resistance alloy plate member 90B and first and second conductors 70B, 80B which are respectively joined to one side and the other side in the current flow direction of the resistance alloy plate member 90B.

The plate thickness of at least either one of the first and second conductors 70B, 80B is set larger than the plate thickness of the resistance alloy plate member 90B as with Embodiments 1 to 3.

In the embodiment illustrated in the figures, the plate thickness of both the first and second conductors 70B, 80B is set larger than the plate thickness of the resistance alloy plate member.

As illustrated in FIGS. 7A and 7B, the joining surfaces of the conductors (both the first and second conductors 70B, 80B in this embodiment) in which the plate thickness is set larger than that of the resistance alloy plate member 90B have first inclined regions 75a and 85a located on the side opposite to the resistance alloy plate member 90B with respect to the plate surface direction from one side toward the other side in the plate thickness direction and second inclined regions 75b, 85b located on a side approaching the resistance alloy plate member 90B with respect to the plate surface direction from the edges on the other side in the plate thickness direction of the first inclined regions 75a and 85a toward the other side in the plate thickness direction.

While configured as described above, the conductors (both the first and second conductors 70B, 80B in this embodiment) in which the plate thickness is set larger than that of the resistance alloy plate member 90B have first plate-thickness-direction extending surfaces 77a, 87a extending from the edge on one side in the plate thickness direction of the first inclined region 75a, 85a to one side in the plate thickness direction, and second plate-thickness-direction extending surfaces 77b, 87b extending from the edges on the other side in the plate thickness direction of the second inclined regions 75b, 85b to the other side in the plate thickness direction. The first plate surfaces 11, 21 and the second plate surfaces 12, 22 of the conductors having a large plate thickness each extend from the edges on one side in the plate thickness direction of the first plate-thickness-direction extending surfaces 77a, 87a and from the edges on the other side in the plate thickness direction of the second plate-thickness-direction extending surfaces 77b, 87b, respectively, to the side opposite to the resistance alloy plate member 90B with respect to the plate surface direction.

Meanwhile, the joining surfaces joined to the conductors having a larger plate thickness out of the resistance-alloy-side first and second joining surfaces of the resistance alloy plate member 90B have first and second inclined regions 95a(1), 95b(1) (95b(2), 95b(2)) corresponding to the first and second inclined regions 75a (85a) and 75b (85b) in the conductors having a larger plate thickness.

As described above, both the first and second conductors 70B, 80B are set to have a large plate thickness, and therefore the resistance-alloy-side first joining surface has the first and second inclined regions 95a(1), 95b(1) and the resistance-alloy-side second joining surface has the first and second inclined regions 95a(2), 95b(2) in this embodiment.

The welding process in which both the joining surfaces to be welded have the first and second inclined regions (75a, 75b, 95a(1), 95b(1)) (85a, 85b, 95a(2), 95b(2)) out of the first conductor welding process and the second conductor welding process is configured so as to include a welding process on one side in the plate thickness direction of emitting the electron beams or the laser X from one side in the plate thickness direction to the first inclined regions (75a, 95a(1)) (85a, 95a(2)) in a state where the emission direction is set along the first inclined regions to weld the first inclined regions, and a welding process on the other side in the plate thickness direction of emitting the electron beams or the laser X from the other side in the plate thickness direction to the second inclined regions (75b, 95b(1)) (85b, 95b(2)) of both the joining surfaces in a state where the emission direction is set along the second inclined regions to weld the second inclined regions.

In this embodiment, both the first and second conductor welding processes are welding processes in which the joining surfaces to be welded include the first and second inclined regions.

In this case, the first conductor welding process includes a first conductor welding process on one side in the plate thickness direction in which electron beams or a laser Xa(1) whose emission direction is set along the first inclined regions 75a, 95a(1) is emitted from one side in the plate thickness direction to the first inclined region 75a of the first-conductor-side joining surface and the first inclined region 95a(1) of the residence alloy side first joining surface, and a first conductor welding process on the other side in the plate thickness direction in which electron beams or a laser Xb(1) whose emission direction is set along the second inclined regions 75b, 95b(1) is emitted from the other side in the plate thickness direction to the second inclined region 75b of the first-conductor-side joining surface and the second inclined region 95b(1) of the residence alloy side first joining surface.

The second conductor welding process includes a second conductor welding process on one side in the plate thickness direction in which electron beams or a laser Xa(2) whose emission direction is set along the first inclined regions 85a, 95a(2) from one side in the plate thickness direction to the first inclined region 85a of the second-conductor-side joining surface and the first inclined region 95a(2) of the residence alloy side second joining surface, and a second conductor welding process on the other side in the plate thickness direction in which electron beams or a laser Xb(2) whose emission direction is set along the second inclined regions 85b, 95b(2) is emitted from the other side in the plate thickness direction to the second inclined region 85b of the second-conductor-side joining surface and the second inclined region 95b(2) of the residence alloy side second joining surface.

The order of the first conductor welding process on one side in the plate thickness direction, the first conductor welding process on the other side in the plate thickness direction, the second conductor welding process on one side in the plate thickness direction, and the second conductor welding process on the other side in the plate thickness direction is not limited and it is preferable to collectively perform each of the emission of the electron beams or the laser Xa(1) and the laser Xa(2) from one side in the plate thickness direction and the emission of the electron beams or the laser Xb(1) and the laser XB(2) from the other side in the plate thickness direction from the viewpoint of working efficiency.

More specifically, the first conductor welding process on one side in the plate thickness direction and the second conductor welding process on one side in the plate thickness direction can be performed as one welding process, and, before or after the welding process, the first conductor welding process on the other side in the plate thickness direction and the second conductor welding process on the other side in the plate thickness direction can be performed as one welding process.

Also in this embodiment, the same effects as those in Embodiments 1 to 3 can be obtained.

Furthermore, the shunt resistor 4A of this embodiment has the second plate-thickness-direction extending surfaces 77b, 87b which are not provided in the shunt resistor 3A of Embodiment 3 and the second plate-thickness-direction extending surfaces 77b, 87b also effectively demonstrate a heat radiation action.

Therefore, the shunt resistor 4A of this embodiment can further improve the heat radiation properties as compared with the shunt resistor 3A of Embodiment 3.

Embodiment 5

Hereinafter, still yet another embodiment of the method for manufacturing a shunt resistor according to the present invention is described with reference to the accompanying drawings.

Figure 8:
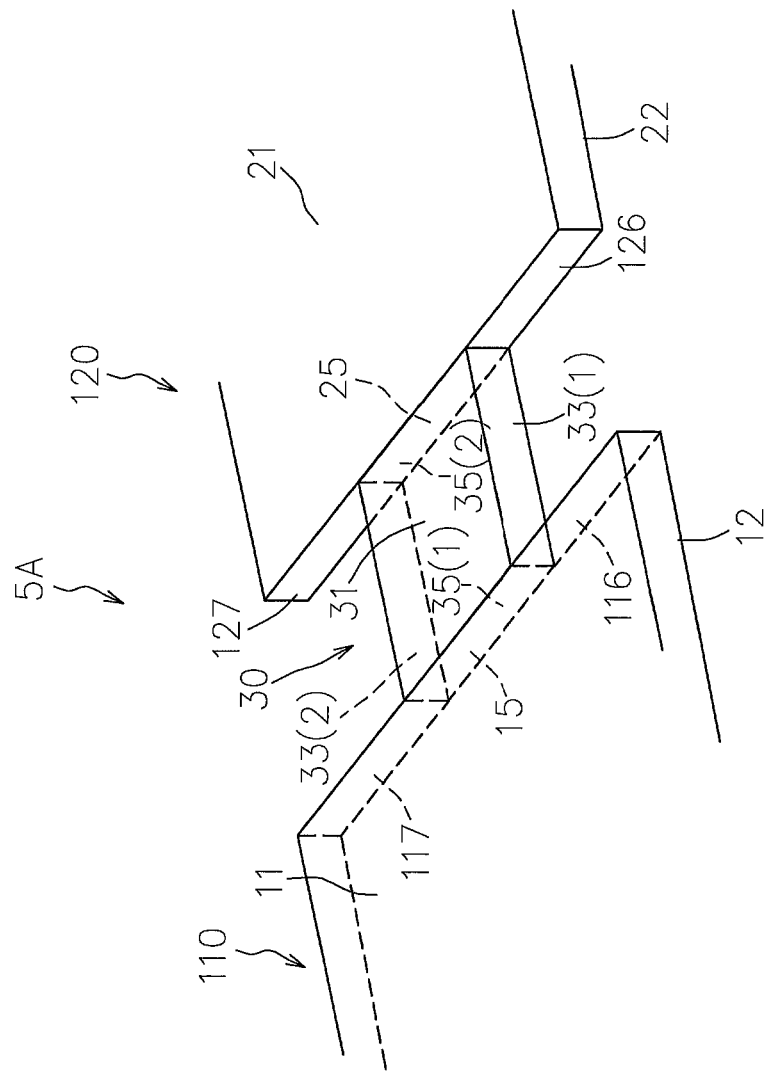
FIG. 8 is a perspective view of a shunt resistor manufactured by a manufacturing method according to a fifth embodiment of the present invention.

FIG. 8 illustrates a partial perspective view of a shunt resistor 5A manufactured by the manufacturing method according to this embodiment.

In the figure, the same members as those in Embodiments 1 to 4 are designated by the same reference numerals and a description thereof is omitted as appropriate.

The shunt resistor 5A has the resistance alloy plate member 30 and first and second conductors 110, 120 which are respectively joined to one side and the other side in the current flow direction of the resistance alloy plate member 30.

The first conductor welding process is configured so as to cause the first-conductor-side joining surface 15 and the resistance-alloy-side first joining surface 35(1) to abut on each other so that the edges on one side in the plate thickness direction thereof are positioned at the same position in the plate thickness direction, and then emit electron beams or the laser X to both the joining surfaces 15, 35(1) in the abutted state from one side in the plate thickness direction to weld both the joining surfaces 15, 35(1).

Similarly, the second conductor welding process is configured so as to cause the second-conductor-side joining surface 25 and the resistance-alloy-side second joining surface 35(2) to abut on each other so that the edges on one side in the plate thickness direction thereof are positioned at the same position in the thickness direction, and then emit the electron beams or the laser X to both the joining surfaces 25 and 35(2) in the abutted state from one side in the plate thickness direction to weld both the joining surfaces 25 and 35(2).

While such a configuration is provided, at least either one of the first and second conductors 110, 120 is set wider than the resistance alloy plate member 30.

In the embodiment illustrated in the figure, the width of both the first and second conductors 110, 120 is set larger than the width of the resistance alloy plate member 30.

Specifically, as illustrated in FIG. 8, the first conductor 110 has first and second width direction extending surfaces 116, 117 each extending from the first-conductor-side joining surface 15 to one side and the other side in the width direction.

Similarly, the second conductor 120 has first and second width direction extending surfaces 126, 127 each extending from the second-conductor-side joining surface 25 to one side and the other side in the width direction.

Also in this embodiment of such a configuration, the same effects as those in Embodiments 1 to 4 can be obtained.

Preferably, a configuration equivalent to the inclined surfaces 16 and 26 of the first and second conductors 10, 20 in Embodiment 1 is applicable to at least either one of the first and second conductors 110, 120 in this embodiment.

Figure 9:
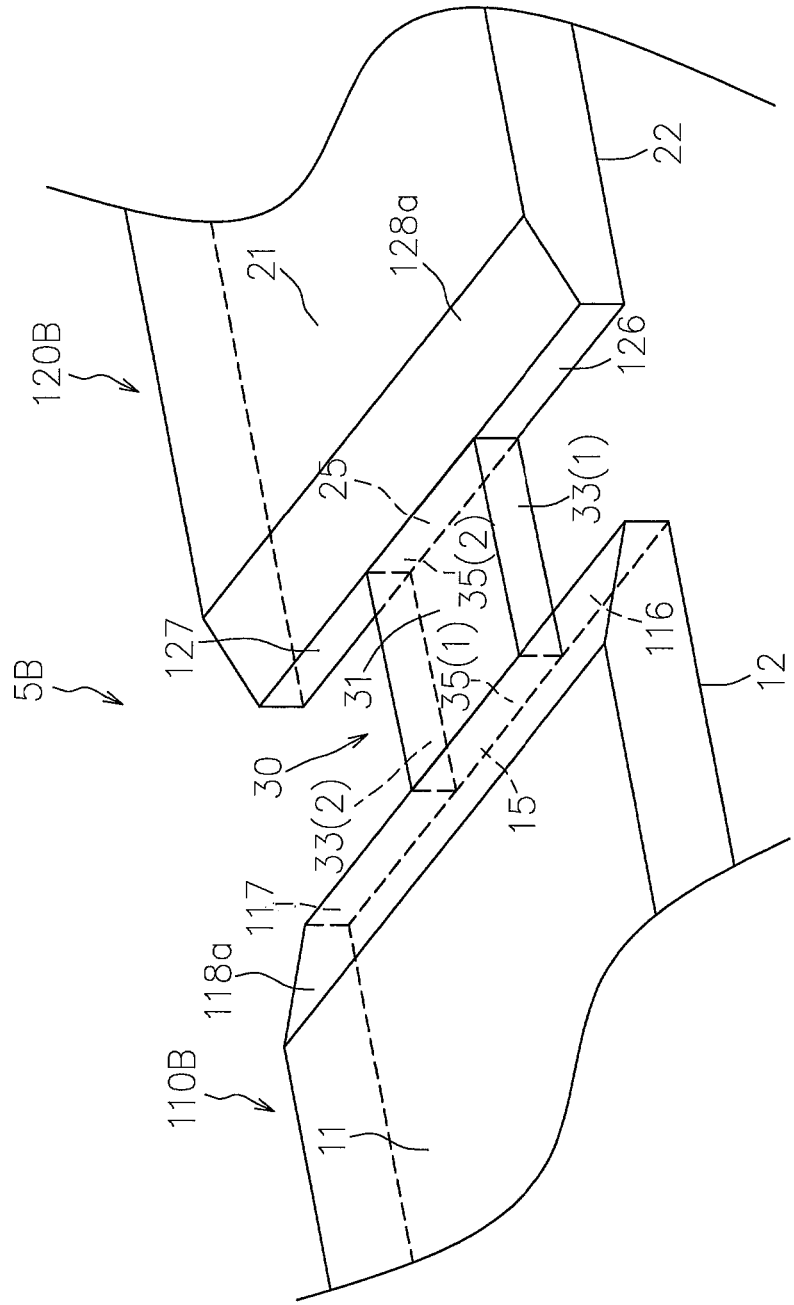
FIG. 9 is a perspective view of a shunt resistor manufactured by a manufacturing method according to a modification of the fifth embodiment.

FIG. 9 illustrates a perspective view of a modification 5B of this embodiment to which such a configuration is applied.

The shunt resistor 5B of the modification illustrated in FIG. 9 has first and second conductors 110B and 120B in place of the first and second conductors 110, 120 as compared with the shunt resistor 5A.

The first conductor 110B has a first inclined surface 118a located on one side in the plate thickness direction from the edges on one side in the plate thickness direction of the first-conductor-side joining surface 15, the first width direction extending surfaces 116, and the second width direction extending surface 117 toward the side opposite to the resistance alloy plate member 30 with respect to the plate surface direction and, in the first conductor 110B, the first plate surface 11 extends to the side opposite to the resistance alloy plate member 30 with respect to the plate surface direction from the edge on one side in the plate thickness direction of the first inclined surface 118a.

Similarly, the second conductor 120B has a first inclined surface 128a located on one side in the plate thickness direction from the edges on one side in the plate thickness direction of the first-conductor-side joining surface 25, the first width direction extending surface 126, and the second width direction extending surface 127 toward the side opposite to the resistance alloy plate member 30 with respect to the plate surface direction and, in the first conductor 120B, the first plate surface 21 extends to the side opposite to the resistance alloy plate member 30 with respect to the plate surface direction from the edge on one side in the plate thickness direction of the first inclined surface 128a.

According to the modification 5B illustrated in FIG. 9, the heat radiation properties of the resistance alloy plate member 30 can be further improved.

In the modification 5B illustrated in FIG. 9, the first conductor 110B and/or the second conductor 120B can also be provided with a second inclined surface located on the other side in the plate thickness direction from the edges on the other side in the plate thickness direction of the corresponding conductor side joining surface, the corresponding first width direction extending surface, and the corresponding second width direction extending surface toward the side opposite to the resistance alloy plate member 30 with respect to the plate surface direction. Thus, the heat radiation properties of the resistance alloy plate member 30 can be further improved.

Embodiment 6

Hereinafter, still yet another embodiment of the method for manufacturing a shunt resistor according to the present invention is described with reference to the accompanying drawings.

FIGS. 10A and 10B illustrate a side view and an exploded side view, respectively, of a shunt resistor 6A manufactured by the manufacturing method according to this embodiment.

In the figures, the same members as those in Embodiments 1 to 5 are designated by the same reference numerals and a description thereof is omitted as appropriate.

The shunt resistor 6A has the resistance alloy plate member 30 and first and second conductors 150, 160 which are respectively joined to one side and the other side in the current flow direction of the resistance alloy plate member 30.

The plate thickness of at least either one of the first and second conductors 150, 160 is set larger than the plate thickness of the resistance alloy plate member 30.

In the embodiment illustrated in the figures, the plate thickness of both the first and second conductors 150, 160 is set larger than the plate thickness of the resistance alloy plate member 30.

As illustrated in FIGS. 10A and 10B, the conductors (both the first and second conductors 150, 160 in this embodiment) in which the plate thickness is set larger than that of the resistance alloy plate member 30 have conductor side joining surfaces 155, 165 which are caused to abut on the corresponding resistance-alloy-side joining surfaces 35(1), 35(2) of the resistance alloy plate member 30, the first plate surfaces 11, 21 extending to a side separating from the resistance alloy plate member 30 with respect to the plate surface direction from the edges on one side in the plate thickness direction of the conductor side joining surfaces 155, 165, extending surfaces 156, 166 extending to the other side in the plate thickness direction from the edges on the other side in the plate thickness direction of the conductor side joining surfaces 155, 165, and the second plate surfaces 12, 22 extending to the side separating from the resistance alloy plate member 30 with respect to the plate surface direction from the edges on the other side in the plate thickness direction of the extending surfaces 156, 166.

The processes (both the first conductor welding process and the second conductor welding process in this embodiment) of welding the conductors in which the plate thickness is set larger than that of the resistance alloy plate member 30 to the resistance alloy plate member 30 out of the first and second conductor welding processes are configured so as to cause both the joining surfaces (155, 35(1)) (165, 35(2)) of the corresponding conductors 150, 160 and the resistance alloy plate member 30 to abut on each other in a state where the edges on one side in the plate thickness direction of the joining surfaces are positioned at the same position with respect to the plate thickness direction, and then emit the electron beams or the laser X from one side in the plate thickness direction to both the joining surfaces in the abutted state to weld both the joining surfaces.

Also in this embodiment, the same effects as those in Embodiments 1 to 5 described above are achieved, i.e., the shunt resistor 6A in which the radiation properties of heat generated in the resistance alloy plate member 30 can be improved while stabilizing the welding of the first and second conductors 150, 160 and the resistance alloy plate member 30 can be efficiently manufactured.

DESCRIPTION OF THE REFERENCE NUMERALS 1A-6A Shunt resistor
10, 10B First conductor
11 First plate surface
12 Second plate surface
15 First-conductor-side joining surface
16a First inclined surface
16b Second inclined surface
20, 20B Second conductor
21 First plate surface
22 Second plate surface
25 Second-conductor-side joining surface
26a First inclined surface
26b Second inclined surface
30 Resistance alloy plate member
35(1) Resistance-alloy-side first joining surface
35(2) Resistance-alloy-side second joining surface
50, 50B First conductor
56a First plate-surface-direction extending surface
57a First plate-thickness-direction extending surface
60, 60B Second conductor
66a First plate-surface-direction extending surface
67a First plate-thickness-direction extending surface
70, 70B First conductor
75 First-conductor-side joining surface 75a First inclined region of first-conductor-side joining surface
75b Second inclined region of first-conductor-side joining surface
77 First plate-thickness-direction extending surface
77a First plate-thickness-direction extending surface
77b Second plate-thickness-direction extending surface
80, 80b Second conductor
85 Second-conductor-side joining surface
85a First inclined region of second-conductor-side joining surface
85b Second inclined region of second-conductor-side joining surface
87 First plate-thickness-direction extending surface
87a First plate-thickness-direction extending surface
87b Second plate-thickness-direction extending surface
90, 90B Resistance alloy plate member
95(1) Resistance-alloy-side first joining surface
95a(1) First inclined region of resistance-alloy-side first joining surface
95b(1) Second inclined region of resistance-alloy-side first joining surface
95(2) Resistance-alloy-side second joining surface
95a(2) First inclined region of resistance alloy side second joining surface
95b(2) Second inclined region of resistance-alloy-side second joining surface
110, 110B First conductor
118 First inclined surface
120, 120B Second conductor
128a First inclined surface
150 First conductor
155 First-conductor-side joining surface
156 Extending surface
160 Second conductor
165 Second-conductor-side joining surface
166 Extending surface

The invention claimed is:

1. A method of manufacturing a shunt resistor that includes a resistance alloy plate member and first and second conductors respectively joined to one side and the other side in a planar direction that is perpendicular to a plate thickness direction of the resistance alloy plate member, comprising:
a step of providing a resistance alloy plate member that has resistance-alloy-side first and second joining surfaces respectively arranged on one side and the other side in the planar direction;
a step of providing a first conductor having first and second plate surfaces on one side and the other side in the plate thickness directions, respectively, and an end surface connecting edges of the first and second plate surfaces that are close to the resistance alloy plate, the first conductor having a thickness larger than that of the resistance alloy plate, the end surface of the first conductor including a first-conductor-side joining surface that comes into contact with the resistance-alloy-side first joining surface;
a step of providing a second conductor having first and second plate surfaces on one side and the other side in the plate thickness directions, respectively, and an end surface connecting edges of the first and second plate surfaces that are close to the resistance alloy plate, the second conductor having a thickness larger than that of the resistance alloy plate, the end surface of the second conductor including a second-conductor-side joining surface that comes into contact with the resistance-alloy-side second joining surface;
a first conductor welding process of causing the first-conductor-side joining surface and the resistance-alloy-side first joining surface to abut on each other, and then emitting electron beams or laser to the joining surfaces in the abutted state from one side in the plate thickness direction to weld the joining surfaces; and
a second conductor welding process of causing the second-conductor-side joining surface and the resistance-alloy-side second joining surface to abut on each other, and then emitting electron beams or laser to the joining surfaces in the abutted state from one side in the plate thickness direction to weld the joining surfaces;
wherein the end surface of the first conductor includes a first plate-thickness-direction extending surface extending from the edge of the first plate surface that is close to the resistance alloy plate toward the other side in the plate thickness direction, and the first-conductor-side joining surface is inclined so as to be gradually located on the side opposite from the resistance alloy plate member with respect to the plate surface direction from the first plate-thickness-direction extending surface toward the other side in the plate thickness direction and reach the second plate surface,
wherein the end surface of the second conductor includes a first plate-thickness-direction extending surface extending from the edge of the first plate surface that is close to the resistance alloy plate toward the other side in the plate thickness direction, and the first-conductor-side joining surface is inclined so as to be gradually located on the side opposite from the resistance alloy plate member with respect to the plate surface direction from the first plate-thickness-direction extending surface toward the other side in the plate thickness direction and reach the second plate surface,
wherein the resistance-alloy-side first and second joining surfaces are formed into inclined joining surfaces corresponding to the first-conductor-side joining surface and the second-conductor-side joining surface, respectively, and
wherein, in the first conductor welding process and the second conductor welding process, the emission direction of the electron beams or the laser is set along the inclined joining surfaces.

2. A method of manufacturing a shunt resistor that includes a resistance alloy plate member and first and second conductors respectively joined to one side and the other side in a planar direction that is perpendicular to a plate thickness direction of the resistance alloy plate member, comprising:
a step of providing a resistance alloy plate member that has resistance-alloy-side first and second joining surfaces respectively arranged on one side and the other side in the planar direction;
a step of providing a first conductor having first and second plate surfaces on one side and the other side in the plate thickness directions, respectively, and an end surface connecting edges of the first and second plate surfaces that are close to the resistance alloy plate, the first conductor having a thickness larger than that of the resistance alloy plate, the end surface of the first conductor including a first-conductor-side joining surface that comes into contact with the resistance-alloy-side first joining surface;
a step of providing a second conductor having first and second plate surfaces on one side and the other side in the plate thickness directions, respectively, and an end surface connecting edges of the first and second plate surfaces that are close to the resistance alloy plate, the second conductor having a thickness larger than that of the resistance alloy plate, the end surface of the second conductor including a second-conductor-side joining surface that comes into contact with the resistance-alloy-side second joining surface;
a first conductor welding process of causing the first-conductor-side joining surface and the resistance-alloy-side first joining surface to abut on each other, and then emitting electron beams or laser to the joining surfaces in the abutted state from one side in the plate thickness direction to weld the joining surfaces; and
a second conductor welding process of causing the second-conductor-side joining surface and the resistance-alloy-side second joining surface to abut on each other, and then emitting electron beams or laser to the joining surfaces in the abutted state from one side in the plate thickness direction to weld the joining surfaces,
wherein the first-conductor-side joining surface includes a first inclined region that is located on the side opposite from the resistance alloy plate member with respect to the plate surface direction from one side toward the other side in the plate thickness direction, and a second inclined region that is located on the side close to the resistance alloy plate member with respect to the plate surface direction from the first inclined region toward the other side in the plate thickness direction,
wherein the end surface of the first conductor further includes a first plate-thickness-direction extending surface extending from the first inclined region of the first-conductor-side joining surface toward one side in the plate thickness direction, and a second plate-thickness-direction extending surface extending from the second inclined region of the first-conductor-side joining surface toward the other side in the plate thickness direction;
wherein the second-conductor-side joining surface includes a first inclined region that is located on the side opposite from the resistance alloy plate member with respect to the plate surface direction from one side toward the other side in the plate thickness direction, and a second inclined region that is located on the side close to the resistance alloy plate member with respect to the plate surface direction from the first inclined region toward the other side in the plate thickness direction,
wherein the end surface of the second conductor further includes a first plate-thickness-direction extending surface extending from the first inclined region of the second-conductor-side joining surface toward one side in the plate thickness direction, and a second plate-thickness-direction extending surface extending from the second inclined region of the second-conductor-side joining surface toward the other side in the plate thickness direction,
wherein the resistance-alloy-side first joining surface includes first and second inclined regions respectively corresponding to the first and second inclined regions of the first-conductor-side joining surface,
wherein the resistance-alloy-side second joining surface includes first and second inclined regions respectively corresponding to the first and second inclined regions of the second-conductor-side joining surface,
wherein the first conductor welding process, includes a welding process on one side in the plate thickness direction of emitting the electron beams or the laser from one side in the plate thickness direction to the first inclined regions of the resistance-alloy-side first joining surface and the first-conductor-side joining surface in a state where the emission direction is set along the first inclined regions to weld the first inclined regions, and a welding process on the other side in the plate thickness direction of emitting the electron beams or the laser from the other side in the plate thickness direction to the second inclined regions of the resistance-alloy-side first joining surface and the first-conductor-side joining surface in a state where the emission direction is set along the second inclined regions to weld the second inclined regions, and
wherein the second conductor welding process includes a welding process on one side in the plate thickness direction of emitting the electron beams or the laser from one side in the plate thickness direction to the first inclined regions of the resistance-alloy-side second joining surface and the second-conductor-side joining surface in a state where the emission direction is set along the first inclined regions to weld the first inclined regions, and a welding process on the other side in the plate thickness direction of emitting the electron beams or the laser from the other side in the plate thickness direction to the second inclined regions of the resistance-alloy-side second joining surface and the second-conductor-side joining surface in a state where the emission direction is set along the second inclined regions to weld the second inclined regions.

3. A shunt resistor, comprising:
a resistance alloy plate member that includes resistance-alloy-side first and second plate surfaces on one side and the other side in the plate thickness direction, and resistance-alloy-side first and second joining surfaces jointed to the first and second conductors, respectively;
a first conductor joined to one side in a planar direction that is perpendicular to a plate thickness direction of the resistance alloy member, wherein the first conductor that has a plate thickness larger than that of the resistance alloy plate member, and includes a first-conductor-side joining surface jointed to the resistance-alloy-side first joining surface, a first-conductor-side first plate-thickness-direction extending surface extending from the first-conductor-side joining surface toward one side in the plate thickness direction, a first-conductor-side first plate surface directed to one side in the plate thickness direction and extending from the first-conductor-side first plate-thickness-direction extending surface toward an opposite side from the resistance alloy plate member with respect to with respect to the plate surface direction, and a first-conductor-side second plate surface directed to the other side in the plate thickness direction and extending from the first-conductor-side joining surface toward an opposite side from the resistance alloy plate member with respect to with respect to the plate surface direction, the first-conductor-side joining surface being inclined so as to be gradually located on the side opposite from the resistance alloy plate member with respect to the plate surface direction from one side toward the other side in the plate thickness direction; and
a second conductor joined to the other side in the planar direction that has a plate thickness larger than that of the resistance alloy plate member, and includes a second-conductor-side joining surface jointed to the resistance-alloy-side second joining surface, a second-conductor-side first plate-thickness-direction extending surface extending from the second-conductor-side joining surface toward one side in the plate thickness direction, a second-conductor-side first plate surface directed to one side in the plate thickness direction and extending from the second-conductor-side first plate-thickness-direction extending surface toward an opposite side from the resistance alloy plate member with respect to with respect to the plate surface direction, and a second-conductor-side second plate surface directed to the other side in the plate thickness direction and extending from the second-conductor-side joining surface toward an opposite side from the resistance alloy plate member with respect to with respect to the plate surface direction, the second-conductor-side joining surface being inclined so as to be gradually located on the side opposite from the resistance alloy plate member with respect to the plate surface direction from one side toward the other side in the plate thickness direction, wherein the resistance-alloy-side first and second joining surfaces are inclined joining surfaces corresponding to the first-conductor-side joining surface and the second-conductor-side joining surface, respectively.

4. A shunt resistor, comprising a resistance alloy plate member that includes resistance-alloy-side first and second plate surfaces on one side and the other side in the plate thickness direction, and resistance-alloy-side first and second joining surfaces jointed to the first and second conductors, respectively;

a first conductor jointed to one side of the resistance alloy plate member in a planar direction that is perpendicular to a plate thickness direction, wherein the first conductor has a plate thickness larger than that of the resistance alloy plate member, and includes a first-conductor-side joining surface jointed to the resistance-alloy-side first joining surface, a first-conductor-side first plate-thickness-direction extending surface extending from the first-conductor-side joining surface toward one side in the plate thickness direction, a first-conductor-side first plate surface directed to one side in the plate thickness direction and extending from the first-conductor-side first plate-thickness-direction extending surface toward an opposite side from the resistance alloy plate member with respect to with respect to the plate surface direction, a first-conductor-side second plate-thickness-direction extending surface extending from the first-conductor-side joining surface toward the other side in the plate thickness direction, and a first-conductor-side second plate surface directed to the other side in the plate thickness direction and extending from the first-conductor-side second plate-thickness-direction extending surface toward an opposite side from the resistance alloy plate member with respect to with respect to the plate surface direction, the first-conductor-side joining surface including a first inclined region that is located on the side opposite from the resistance alloy plate member with respect to the plate surface direction from one side toward the other side in the plate thickness direction and a second inclined region that is located on the side close to the resistance alloy plate member with respect to the plate surface direction from the first inclined region toward the other side in the plate thickness direction; and a second conductor joined to the other side in the planar direction that has a plate thickness larger than that of the resistance alloy plate member, and includes a second-conductor-side joining surface jointed to the resistance-alloy-side second joining surface, a second-conductor-side first plate-thickness-direction extending surface extending from the second-conductor-side joining surface toward one side in the plate thickness direction, a second-conductor-side first plate surface directed to one side in the plate thickness direction and extending from the second-conductor-side first plate-thickness-direction extending surface toward an opposite side from the resistance alloy plate member with respect to with respect to the plate surface direction, a second-conductor-side second plate-thickness-direction extending surface extending from the second-conductor-side joining surface toward the other side in the plate thickness direction, and a second-conductor-side second plate surface directed to the other side in the plate thickness direction and extending from the second-conductor-side second plate-thickness-direction extending surface toward an opposite side from the resistance alloy plate member with respect to with respect to the plate surface direction, the second-conductor-side joining surface including a first inclined region that is located on the side opposite from the resistance alloy plate member with respect to the plate surface direction from one side toward the other side in the plate thickness direction and a second inclined region that is located on the side close to the resistance alloy plate member with respect to the plate surface direction from the first inclined region toward the other side in the plate thickness direction, wherein the resistance-alloy-side first joining surface includes first and second inclined regions respectively corresponding to the first and second inclined regions of the first-conductor-side joining surface, and wherein the resistance-alloy-side second joining surface includes first and second inclined regions respectively corresponding to the first and second inclined regions of the second-conductor-side joining surface.

* * * * *